(12) United States Patent
O'Hara et al.

(10) Patent No.: US 8,836,439 B2
(45) Date of Patent: Sep. 16, 2014

(54) DYNAMIC FREQUENCY TUNING OF ELECTRIC AND MAGNETIC METAMATERIAL RESPONSE

(75) Inventors: John F. O'Hara, Los Alamos, NM (US); Richard Averitt, Newton, MA (US); Willie Padilla, Newton, MA (US); Hou-Tong Chen, Los Alamos, NM (US)

(73) Assignee: Los Alamos National Security LLC, Los Alamos, NM (US)

( * ) Notice: Subject to any disclaimer, the term of this patent is extended or adjusted under 35 U.S.C. 154(b) by 1824 days.

(21) Appl. No.: 11/871,642

(22) Filed: Oct. 12, 2007

(65) Prior Publication Data

US 2009/0096545 A1    Apr. 16, 2009

(51) Int. Cl.
*H01P 7/08* (2006.01)
*H01Q 15/00* (2006.01)
*H03J 1/00* (2006.01)
*H03C 7/02* (2006.01)

(52) U.S. Cl.
CPC ... *H01P 7/08* (2013.01); *H03J 1/00* (2013.01); *H01Q 15/0086* (2013.01); *H03C 7/02* (2013.01)
USPC ............... 331/107 DP; 331/107 SL; 333/235

(58) Field of Classification Search
USPC ............ 333/235; 331/167, 107 DP, 107 SL; 359/244
See application file for complete search history.

(56) References Cited

U.S. PATENT DOCUMENTS

| | | | |
|---|---|---|---|
| 6,232,931 | B1 | 5/2001 | Hart |
| 6,893,790 | B2 | 5/2005 | Lelental et al. |
| 6,911,957 | B2 | 6/2005 | Brown et al. |
| 7,525,711 | B1 * | 4/2009 | Rule et al. ................. 359/244 |
| 2002/0057222 | A1 | 5/2002 | McKinzie et al. |
| 2003/0142036 | A1 | 7/2003 | Wilhelm et al. |
| 2005/0140467 | A1 | 6/2005 | Duwel et al. |
| 2006/0145787 | A1 | 7/2006 | Chem et al. |
| 2007/0215843 | A1 | 9/2007 | Soukoulis et al. |

OTHER PUBLICATIONS

F. Baumann et al. Wet-etch optimization of free-standing terahertz frequency-selective structures. Optics Letters, vol. 28, No. 11, pp. 938-940 (2003).

Y.C. Chan et al. Analysis of a tunable frequency-selective surface on an in-plane biased ferrite substrate. Microwave and Optical Technology Letters, vol. 13, No. 2, pp. 59-63 (1996).

A.R. Chandran et al. Frequency tunable metallo-dielectric structure for backscattering reduction. Electronics Letters, vol. 40, No. 20, pp. 1245-1246 (2004).

H. Chen et al. Controllable left-handed metamaterial and its application to a steerable antenna. Applied Physics Letters, vol. 89, 053509 (2006).

(Continued)

*Primary Examiner* — Joseph Chang
(74) *Attorney, Agent, or Firm* — John P. O'Banion

(57) ABSTRACT

A geometrically modifiable resonator is comprised of a resonator disposed on a substrate, and a means for geometrically modifying the resonator. The geometrically modifiable resonator can achieve active optical and/or electronic control of the frequency response in metamaterials and/or frequency selective surfaces, potentially with sub-picosecond response times. Additionally, the methods taught here can be applied to discrete geometrically modifiable circuit components such as inductors and capacitors. Principally, controlled conductivity regions, using either reversible photodoping or voltage induced depletion activation, are used to modify the geometries of circuit components, thus allowing frequency tuning of resonators without otherwise affecting the bulk substrate electrical properties. The concept is valid over any frequency range in which metamaterials are designed to operate.

27 Claims, 13 Drawing Sheets

(56) References Cited

OTHER PUBLICATIONS

A.C. de C. Lima et al. Tunable frequency selective surface using liquid substrates. Electronics Letters, vol. 30, No. 4, pp. 281-282 (1994).

S. Lim et al. Metamaterial-based electronically controlled transmission-line structures as a novel leaky-wave antenna with tunable radiation angle and beamwidth. IEEE Transactions on Microwave Theory and Techniques, vol. 52, No. 12, pp. 2678-2690 (2004).

W.J. Padilla et al. Dynamic electric and magnetic metamaterial response at terahertz frequencies. Physical Review Letters, vol. 96, 107401 (2006).

V. Sanchez et al. A tunable artificial magnetic conductor using switched capacitance in a concentric overlapping geometry. Antennas and Propagation Society International Symposium (IEEE), vol. 2, pp. 439-442, Jun. 22-27, 2003.

C. Tsakonas et al. Electrically-tunable band-stop filter with mechanically variable bandwidth. Microwave and Optical Technology Letters, vol. 48, No. 1, pp. 53-56 (2006).

J.C. Vardaxoglou et al. Reconfigurable electromagnetic band gap based structures with defects for MM wave and antenna applications. 12th International Conference on Antennas and Propagation, vol. 2, pp. 763-766, Mar. 31-Apr. 3, 2003.

J.M. Zendejas et al. Magnetic MEMS reconfigurable frequency-selective surfaces. Journal of Microelectromechanical systems, vol. 15, No. 3, pp. 613-623 (2006).

C. Mias, Waveguide Demonstration of Varactor-Diode-Tunable Band-Pass Frequency-Selective Surface, Microwave and Optical Technology Letters, Apr. 5, 2005, 62-66, vol. 45, No. 1.

O. Reynet, Voltage Controlled Metamaterial, Applied Physics Letters, Feb. 16, 2004, 1198-1200, vol. 84, No. 7.

I. Gil, Tunable Metamaterial Transmission Lines Based on Varactor-Loaded Split-Ring Resonators, IEEE Transactions on Microwave Theory and Techniques, Jun. 5, 2006, 2665-2674, vol. 54, No. 6.

C. Mias, Frequency Selective Surfaces Loaded with Surface-Mount Reactive Components, Electronic Letters, May 1, 2003, 724-766, vol. 39, No. 9.

J.C. Vardaxoglou, Optical Switching of Frequency Selective Surface Bandpass Response, Electronics Letters, Dec. 5, 1996, 2345-2346, vol. 32, No. 25.

\* cited by examiner

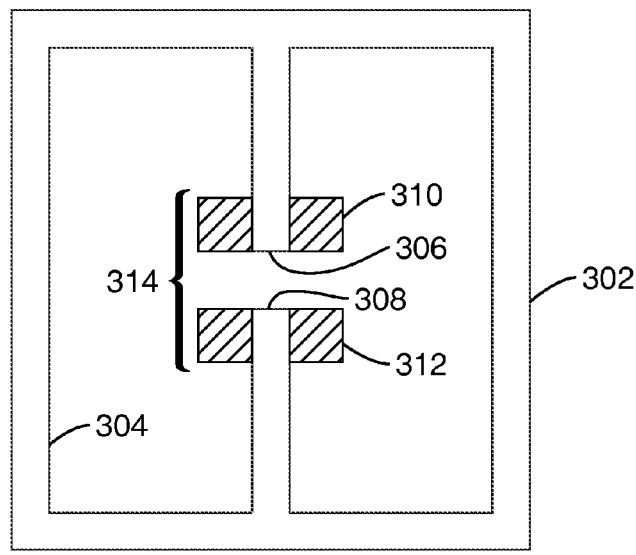
FIG. 3A
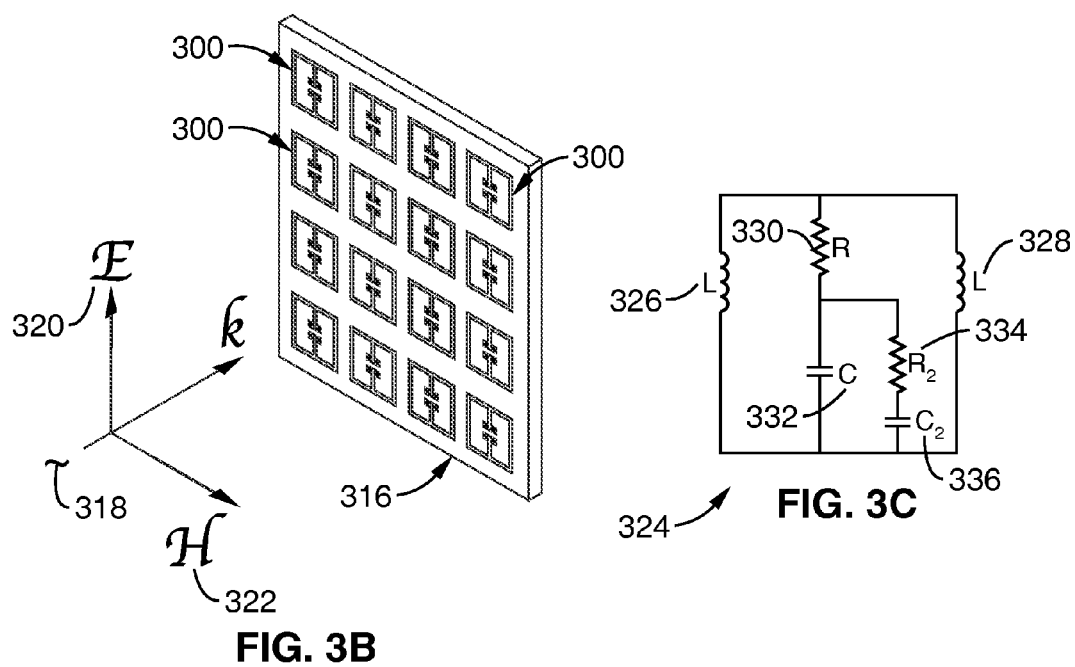
FIG. 3B
FIG. 3C

US 8,836,439 B2

DYNAMIC FREQUENCY TUNING OF ELECTRIC AND MAGNETIC METAMATERIAL RESPONSE

STATEMENT REGARDING FEDERALLY SPONSORED RESEARCH OR DEVELOPMENT

This invention was made with Government support under Contract No. DE-AC52-06NA25396 awarded by the U.S. Department of Energy. The Government has certain rights in this invention.

CROSS-REFERENCE TO RELATED APPLICATIONS

Not Applicable

INCORPORATION-BY-REFERENCE OF MATERIAL SUBMITTED ON A COMPACT DISC

Not Applicable

BACKGROUND OF THE INVENTION

1. Field of the Invention

This invention pertains generally to oscillators, more particularly to oscillators found on frequency selective surfaces (FSS) or metamaterials, and most particularly to variable geometry oscillator elements such as inductors and capacitors found in oscillators comprising FSSs or metamaterials, typically using split-ring-resonator (SRR) elements.

2. Description of Related Art

Materials designed to exhibit specific certain frequency responses have been studied for many years. Before the term 'metamaterials' was coined, these materials were often called 'frequency selective surfaces' (FSS). The main differences between the two classes are: 1) metamaterials are often designed with simultaneous electric and magnetic responses, providing the ability to design both the material permittivity and permeability simultaneously.

FSS, in contrast are generally designed to be either inductive or capacitive in nature, thus creating a resonant behavior but permitting the diversity of design tuning options available in metamaterials. FSS necessarily comprise periodic arrays of sub-wavelength resonators (typically around ½ wavelength in extent). Ultimately this means that the fundamental approach to tailoring the material properties is different. In the case of FSSs, it is a 'structural' approach wherein periodically positioning scattering elements leads to wave interference phenomena that changes the effective behavior of the material as a whole. In the case of metamaterials a 'materials' approach is used wherein a material's constitutive parameters (e.g. permittivity, permeability) themselves are altered. Therefore, in metamaterials, there is no need to invoke wave interference phenomena on the material as a whole and the metamaterial's sub-wavelength resonators need not necessarily be periodically arranged.

There are broad similarities between FSS and metamaterials. FSSs, like metamaterials, are comprised of small resonator structures, also referred to as elements. Each resonator element responds to a specific frequency, which is part of why an array of identical elements behaves as a frequency selective surface, just like metamaterials. However, in FSS, the periodic arrangement of these identical resonators plays a crucial role in generating interference patterns with the electromagnetic wave of resonance. With metamaterials, a periodic arrangement is not required.

Significant levels of research are ongoing in the field of metamaterials, which custom designs allow for the tunability of material parameters such as permeability and permittivity. Recently, dynamical control of these parameters has been demonstrated, but to a very a limited extent. This control was demonstrated by using the so-called split-ring-resonators (SRR), where the resonant behavior of the metamaterial could be rapidly switched on or off by photodoping a semiconductor layer upon which the metallic SRR was fabricated.

Similarly, the resonant response can now be switched both on and off, and may even be amplitude modulated, by the manipulation of a depletion layer in the semiconductor underneath the SRR. These demonstrated dynamic tuning methods, however, will only allow one to switch on, switch off, or modulate the amplitude of the resonant response. Neither of these methods allow for the frequency tuning of the SRR response, which in these examples is entirely determined by the initial fabrication dimensions and layout of the SRR array. Currently, it appears that there is no method by which dynamic frequency modulation can be achieved in metamaterials or FSSs after their initial fabrication. Restating this, it appears that there is no way to alter the initially fabricated resonant frequency of SRR that comprise FSSs or metamaterials.

One potential way to tune the frequency at which a metamaterial exhibits an effective bulk material response would be to change the dimensions and/or geometric layout of the elements that comprise the metamaterial as a whole. While these elements are typically SRRs arranged in a periodic array, the idea is general to any resonant metamaterial structure in any arrangement. The tuning problem here is that these structures are generally comprised of metallic patterns fabricated on an insulator or semiconductor substrate. As such, there is no way to change their size or shape once they are fabricated.

Optical manipulation of FSS has been demonstrated in the literature as early as 1996 by optically stimulating a Si substrate upon which FSS resonant structures were fabricated. This permitted optical switching on and off of the resonant behavior of FSSs. (Vardaxaglou, Electronics Letters 32, pg. 2345, 1996). Again, this method of optical switching did not allow for resonant tuning.

Frequency tuning was similarly performed using FSSs grown on top of ferrite substrates. In this method of tuning, however, the substrate (upon which the FSS structures are grown) is altered via an externally generated magnetic field. When this substrate is altered via the externally generated magnetic field, the substrate then alters the resonant frequency at which the FSS material as a whole responds. (Chan, et al. Microwave and Optical Technology Letters, 13, pg 59, 1996). In the 1996 Chan, et al. paper, the entire substrate underneath the individual resonator structures was altered. By using the Chan substrate alteration method, only the entire substrate may be altered; selective areas of the substrate may not be altered to permit regional or individual resonant structure tunability. Additionally, Chan et al. must provide a highly uniform magnetic field in both strength and direction, otherwise the resonant behavior of the devices may be compromised.

Most other metamaterial or FSS tuning methodologies have involved fabricating voltage controlled lumped elements (such as varactors) disposed between the resonant structures. Varactors are frequently known as semiconductor devices where their capacitance is sensitive to the applied voltage at the boundary of the semiconductor material and an insulator. While voltage controlled lumped elements permit a change in the resonant frequency of the resonant structures, this method suffers from the high complexity of devices and is not as fast as the methods described here. See (Gil et. al, IEEE Trans. Circuits with these Microwave Theory and Tech. 54, pg 2665, 2006), (Mias, Electronics Letters 39, pg 724, 2003), (Reynet et. al, Applied Physics Letters 84, pg 1198, 2004). The Gil methods were only shown for coin-sized microstrip circuits in only one dimension, which is hardly relevant to a close-packed FSS or metamaterial requirement for high frequencies in at least two dimensions. Additionally, the complexity introduced by the voltage controlled lumped elements requires additional photolithographic steps, and further requires more substrate real estate, thereby limiting device density.

Other methods of FSS tuning or metamaterial tuning involve mechanically moved elements, a tremendously slow method compared to charge carrier lifetimes, which can be at a level of sub-picoseconds (ps). See (Tsakonas, Microwave and Optical Technology Letters 48, pg 53, 2006), and (Zendejas et al., Journal of Microelectromechanical Systems 15, pg 613, 2006).

Another method of FSS tuning involves varying the thickness of the superstrate deposited over a substrate (Chandran, A. R., et al., Electronics Letters, 2004, Vol. 40, No. 20). This method is only able to tune to a single frequency during initial fabrication, and testing of the tuning is only possible after completed fabrication.

U.S. Pat. No. 6,911,957 (the '957 patent) discloses a method for dynamically varying a frequency response of a frequency selective surface (FSS). The method can include controlling transmission of electromagnetic energy through a frequency selective surface by passing selected frequencies in a pass-band and blocking selected frequencies in a stop-band. The stop-band and the pass-band can be dynamically modified by controlling at least one of a position and a volume of a conductive fluid that forms a portion of the frequency selective surface. According to one aspect of the method, the conductive fluid can be selected to include gallium and indium alloyed with a material selected from the group consisting of tin, copper, zinc and bismuth.

In the '957 patent, the resonance frequency of a FSS is tuned by injecting a conductive fluid into an array of resonators. FSS are very similar to the resonator structures that form modern metamaterial structures, but important differences do exist, particularly in regard to the magnetic resonance achieved by metamaterial resonators. The introduction of a slow-moving conductive fluid for tuning purposes renders this method exceedingly slow for nearly all frequency tuning applications. What is needed is a method for quickly switching frequencies on electronic timescales (ns, fs, ps, sub-ps, etc.), not on the order of seconds or minutes (at least nine orders of magnitude slower).

U.S. Pat. No. 6,232,931 (the '931 patent) describes an optically controlled frequency selective surface (FSS) that includes an electrically conductive layer having an array of radio frequency scattering elements such as slots formed in an electrically conductive layer or pattern of loops mounted to a substrate. Photonically controlled elements, such as photodiodes, photo-transistors, and other photo-electronic devices, are connected across each of the scattering elements. Electromagnetic characteristics of the FSS, including resonant frequency, impedance, and the pass/stop band, may in turn be modulated by controlling the degree of illumination of the photonically controlled elements.

The '931 patent does describe a method of tuning the resonant frequency of a FSS surface by means of optical illumination. However, it seems to be limited to only radio waves, and describes a method of altering resonant structures by means of the insertion of photosensitive devices (or lumped elements such as transistors) within individual slotted resonators, and not by modifying the geometry of any component inductor or capacitor. The '931 patent apparently only discusses FSS and does not appear to discuss metamaterials. It does appear that all of the photo-controlled elements are selected from the group that includes bulk semiconductor switched, photocells, photodiodes, phototransistors, and photovoltaic controlled field effect transistors.

What is needed is a method for dynamically frequency tuning small resonant elements, either on FSS or metamaterials or discretely, that does not require complicated device fabrications within slotted resonant structures, and therefore could be applied to much smaller resonant elements and thereby operate at higher frequencies. Ideally, one would be able to change material fundamental constitutive parameters, not just change in the resonance of wave interference phenomena. Such a device could be very important as metamaterials progress to higher and higher frequencies (e.g. visible light) where strict periodic placement of sub-wavelength resonators required in FSS is likely to become difficult, if not impossible.

BRIEF SUMMARY OF THE INVENTION

An aspect of the invention is a geometrically modifiable resonator, comprising: a resonator disposed on a substrate; and a means for geometrically modifying the resonator. The resonator may be one of a plurality of resonator elements comprising a metamaterial. Alternatively, the resonator may be one of a plurality of resonator elements comprising a frequency selective surface. In yet another alternative, the resonator may be a discrete device.

In one embodiment, a plurality of geometrically modifiable resonators may be disposed in a periodic array. They may also be disposed in an aperiodic manner.

The means for geometrically modifying the resonator does not alter the substrate. This means that the bulk electrical and/or optical properties of the substrate remain unchanged during the geometric modification.

Typically, the geometrically modifiable resonator comprises a split ring resonator (SRR). This is due to several relative factors: high packing density, low cost fabrication, high yield, and simplicity of design.

The means for geometrically modifying the resonator may comprise: one or more controlled conductivity regions that allow a change of geometry of an element of the resonator in one or more of the group consisting of: an inductance and a capacitor. This change of geometry of an element may comprise areas that essentially add to the existing configuration of an inductor or capacitor. Where areas are added to an inductor, it may effect a decrease in inductance where the non-modified inductor is shorted by the geometry change. Alternatively, areas added to an inductor to perform a change in geometry may comprise the addition of regions that parallel the non-modified inductor, so as to reduce inductance, as in the case of a microstrip line.

The controlled conductivity regions may comprise a photoconductive semiconductor that increases in conductivity through reversible photodoping. Such photoconductive semiconductor may have a band gap such that light having energy below the band gap will not actuate it, but light above the band gap would. Thus, a single device could be constructed of multiple photoconductive semiconductors to allow for differing activations of the controlled conductivity regions. Additionally, the external photodoping could be controlled as to location, thereby controllably activating different controlled conductivity regions.

Alternatively, the controlled conductivity regions may comprise a voltage induced depletion layer of semiconductor that increases in conductivity through application of a voltage. Such voltage may be generated from another device on the FSS or metamaterial, and could be designed to be retained after initial manufacture to provide for retuning from the initial fabrication state.

Another aspect of the invention, the change of geometry of an element of the resonator may comprise a change of shape of the element. That is, the initial shape is different than the effective shape is when the controlled conductivity region is activated (e.g. from rectangular to non-rectangular). The change of geometry of an element of the resonator may also comprise a change of scale of the element either isotropically or anisotropically in a localized region of the substrate.

In another embodiment, the resonator may comprise one element in a terahertz (THz) radar system.

Another aspect of the invention is a method for fabricating a geometrically modifiable resonator, comprising: fabricating a resonator component and fabricating a charge controlled region able to geometrically modify the component, where the electrical properties of the component are altered. These geometrically modifiable components may be selected from one of a group of components consisting of: an inductor, and a capacitor. Using these geometrically modifiable components, a product may be produced with extremely fast tuning (sub-ps) capabilities.

In another aspect of the invention, a geometrically modifiable circuit component may be constructed, where the circuit component may be selected from a group consisting of: a geometrically modifiable inductor; and a geometrically modifiable capacitor. A geometrically modifiable resonator may be constructed from one or more of the geometrically modifiable circuit components.

Building from the geometrically modifiable resonator just discussed above, one or more geometrically modifiable resonators may be used to construct a metamaterial. Alternatively, one or more geometrically modifiable resonators may be used to construct a frequency selective surface.

Still another embodiment of this invention is a frequency modulator, comprising: one or more geometrically modifiable resonators, each geometrically modifiable resonator comprising one or more controlled conductivity regions; whereby the controlled conductivity regions are activated to change a resonance frequency of the geometrically modifiable resonators. These controlled conductivity regions may be activated by a method selected from the group consisting of: reversible photodoping to the controlled conductivity regions and application of a control voltage to the controlled conductivity regions.

The frequency modulator may have the resonance frequency corresponding to a wavelength selected from the group consisting of: laser emitted light wavelength; a microwave wavelength; a wavelength of 1550 nm±5%; and a wavelength from 10 nm to 1 m. Thus, such a frequency modulator could be useful from extreme ultraviolet wave lengths, to visible light, to radio waves of virtually any wavelength. However, existing fabrication limitations and SRR high frequency losses may limit operation to around 800 nm wavelengths and longer. So, alternative designs would likely be required for higher frequency operation.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

Figure 1A:
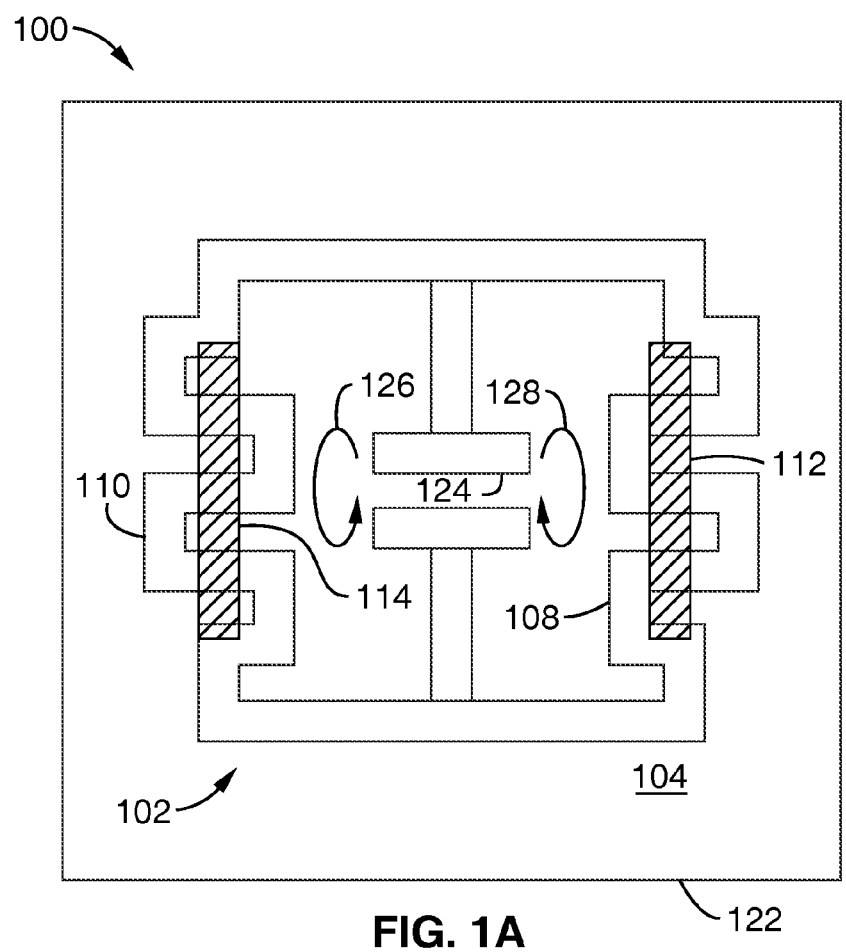
FIG. 1A is a top view of a split ring resonator (SRR) element with two hatched controlled conductivity regions (CCRs) that provides for decreasing the inductance of the meandering conductors to which they are attached.
Figure 1B:
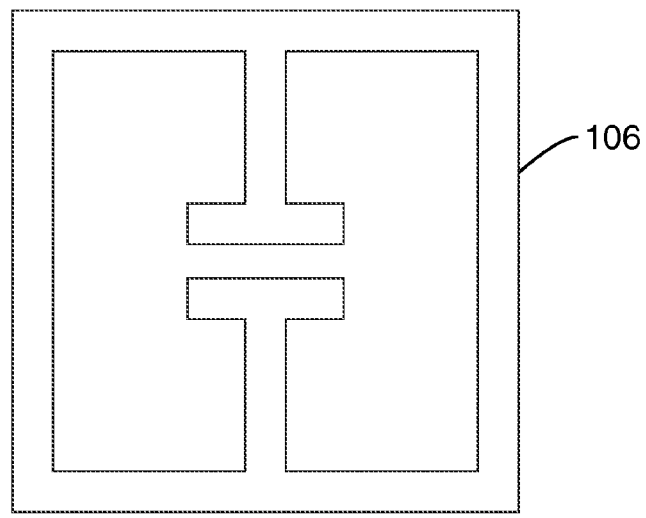
FIG. 1B is a top view of an original split ring resonator (SRR) that is comprised of only fixed inductors, that operates at only one fixed frequency.
Figure 1C:
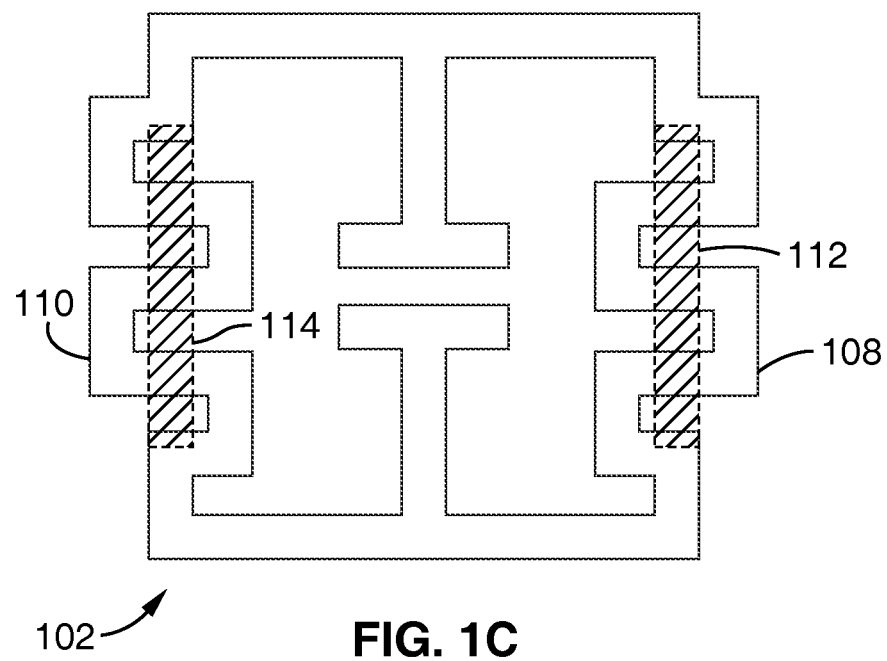
FIG. 1C is a top view of the original split ring resonator (SRR) that has been redesigned with meandering conductors acting as inductors, with controlled conductivity regions provided to allow for operation within a designed range of operating frequencies.
Figure 1D:
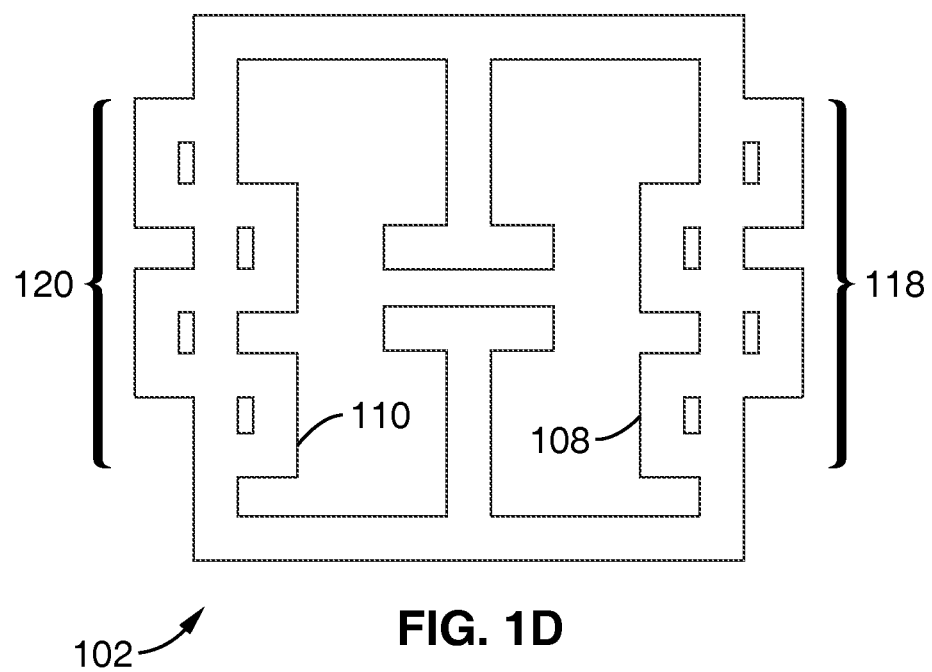
FIG. 1D is a top view of the redesigned meandering conductor split ring resonator (SRR) of FIG. 1C, where the conductivity of the controlled conductivity regions have been activated to their maximum conductivity.
Figure 1E:
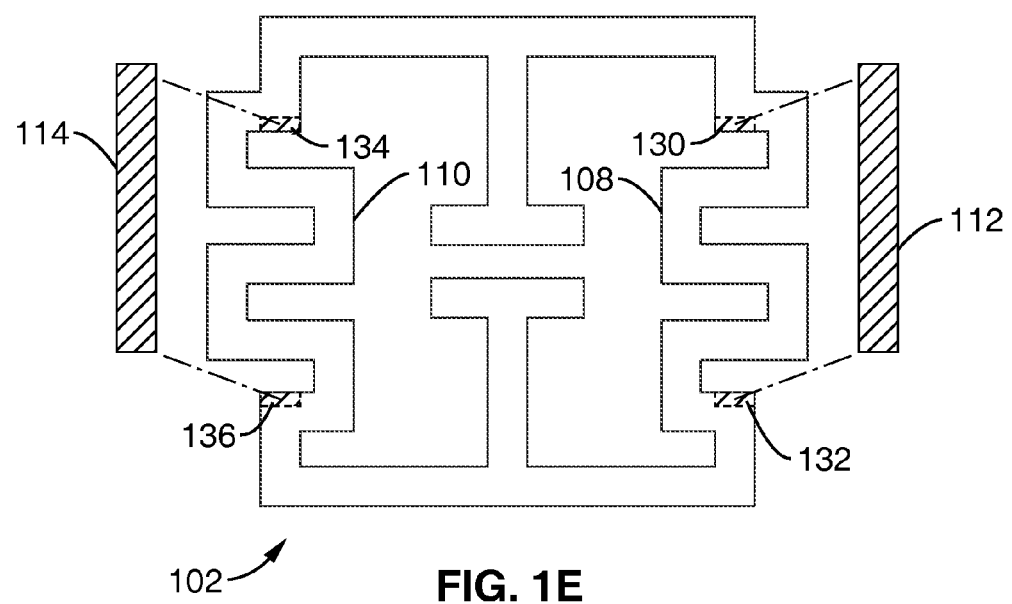

FIG. 1E is an exploded top view of the redesigned meandering conductor split ring resonator (SRR) of FIG. 1C, where the controlled conductivity regions are only attached at the beginning and ends of the meandering conductors, so that when the conductivity of the controlled conductivity regions is sufficiently great (here the controlled conductivity regions have been activated to their maximum conductivity) the meandering conductors and controlled conductivity regions are substantially paralleled so as to effectively reduce the component inductances presented to the SRR, resulting in a higher operating frequency of the SRR.

FIG. 2A-G are plots of modeled transmission response of numerical simulations of a metamaterial comprised of the tuned split ring resonator (SRR) of FIG. 1A's SRR element 100 calculated by altering the conductivity of the CCRs in the meandering split-ring-resonator through a range of values. All plots have an ordinate range of 0-2 THz, and abscissa range of −20 to 0 dB.

Figure 2A:
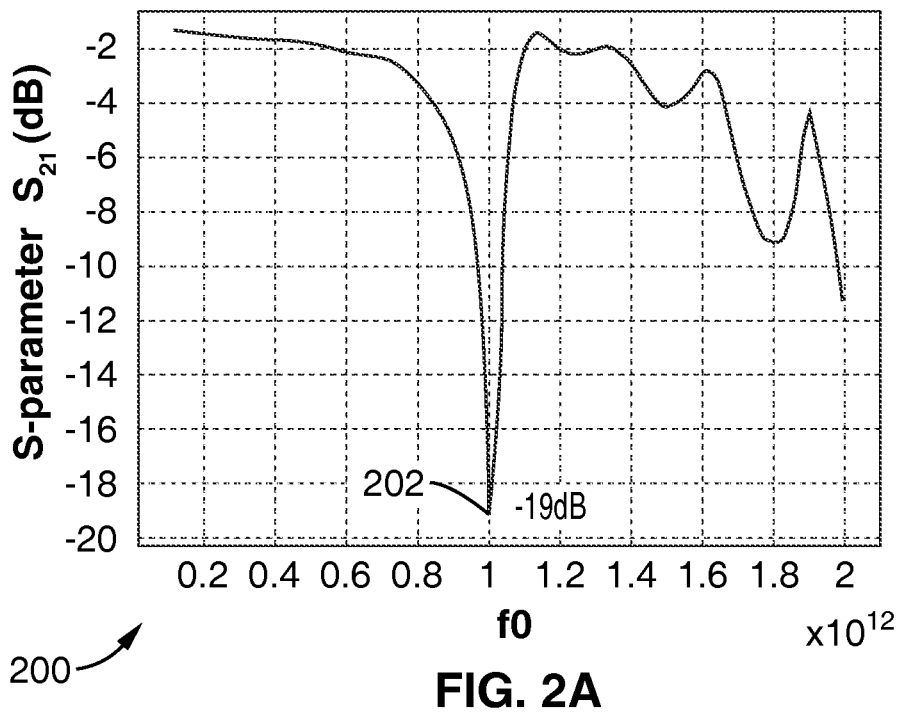

FIG. 2A is a plot of modeled response of a metamaterial with a maximum conductivity of $10^3$ S/m.

Figure 2B:
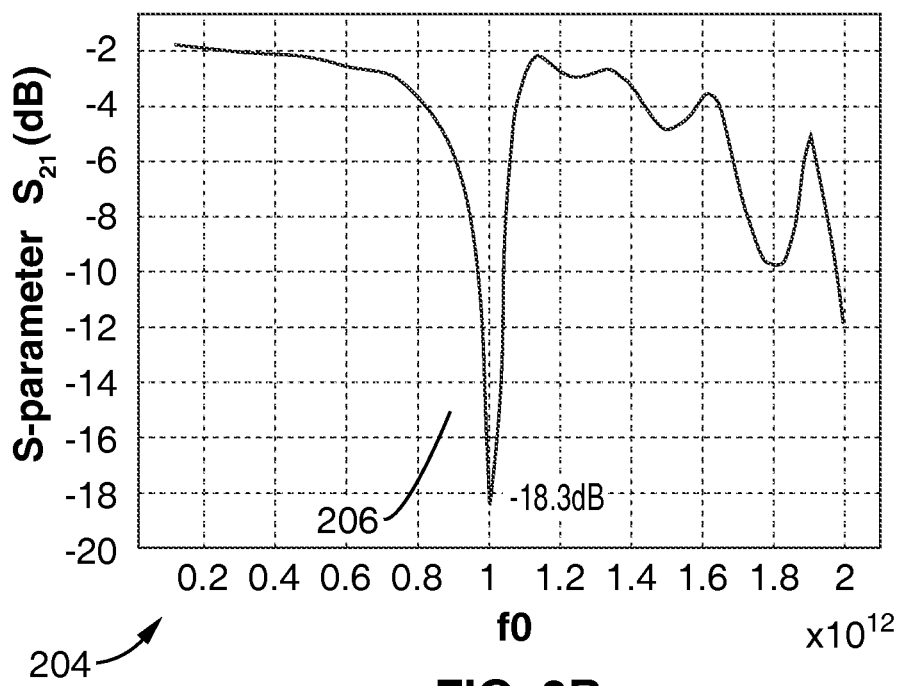

FIG. 2B is a plot of modeled response of a metamaterial with a maximum conductivity of $10^4$ S/m.

Figure 2C:
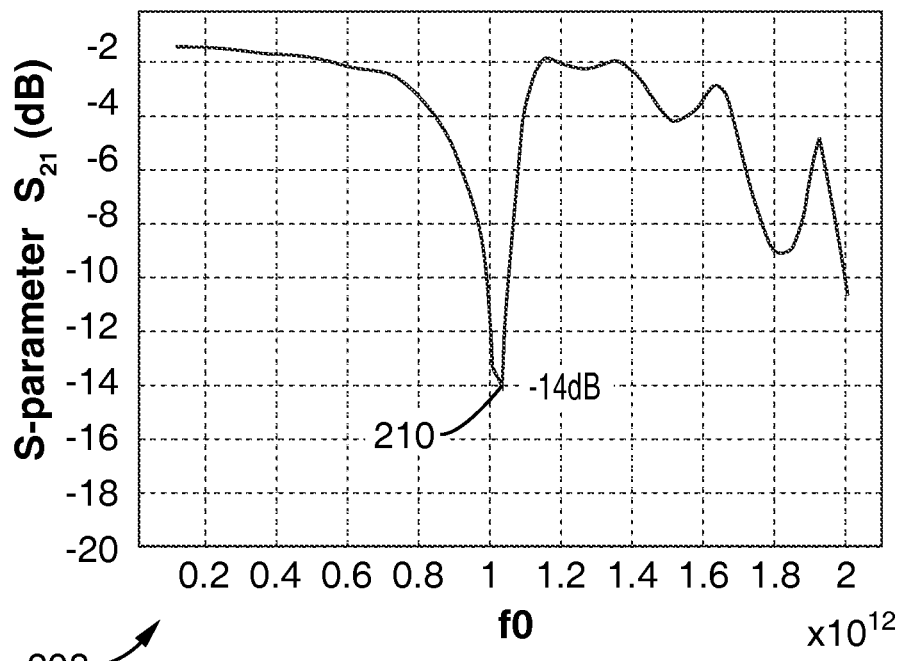

FIG. 2C is a plot of modeled response of a metamaterial with a maximum conductivity of $5\times10^4$ S/m.

Figure 2D:
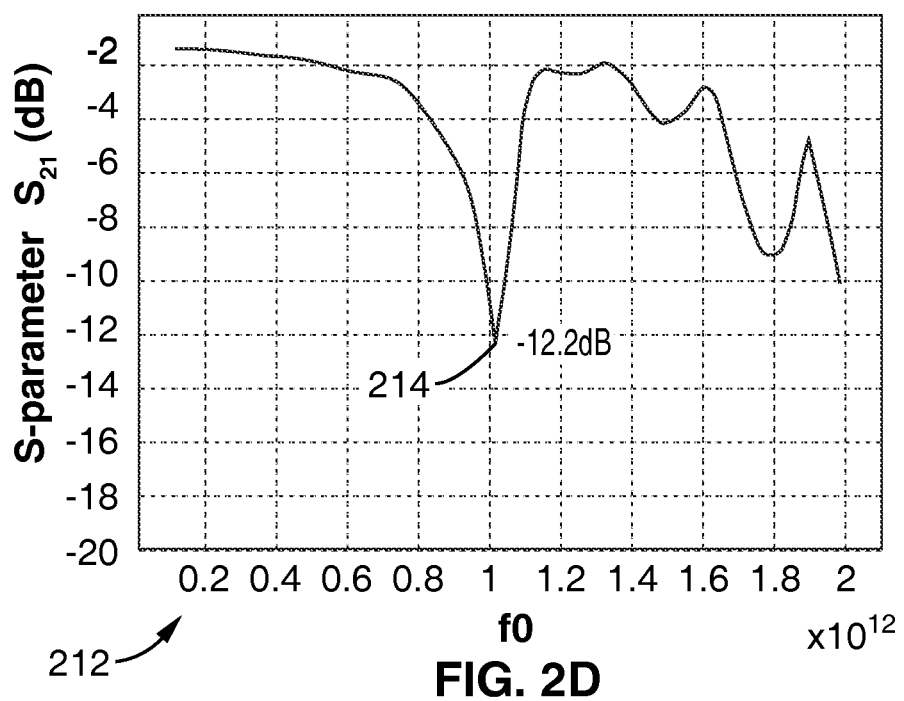

FIG. 2D is a plot of modeled response of a metamaterial with a maximum conductivity of $10^5$ S/m.

Figure 2E:
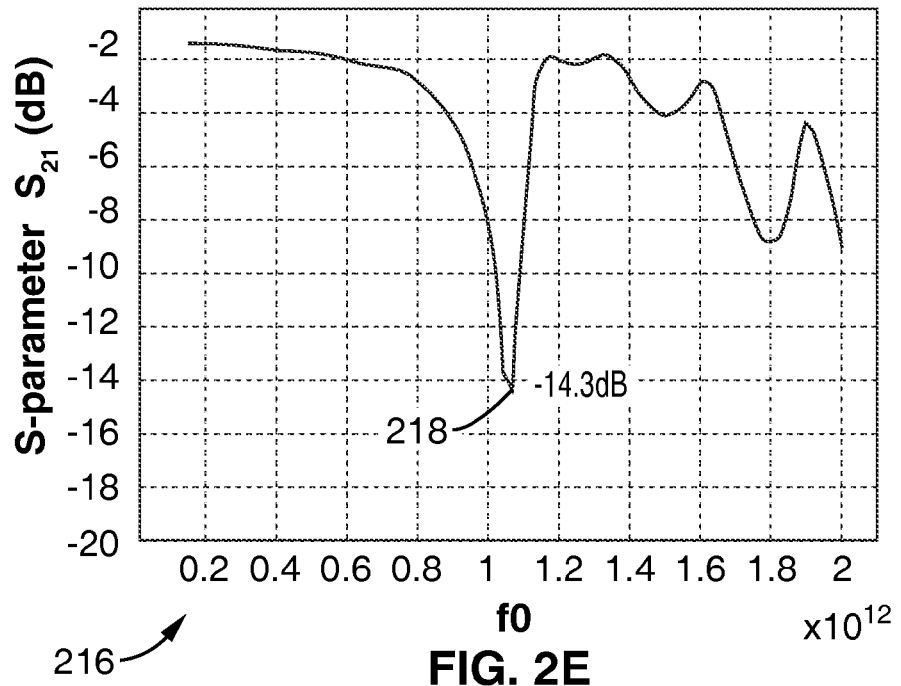

FIG. 2E is a plot of modeled response of a metamaterial with a maximum conductivity of $5\times10^5$ S/m.

Figure 2F:
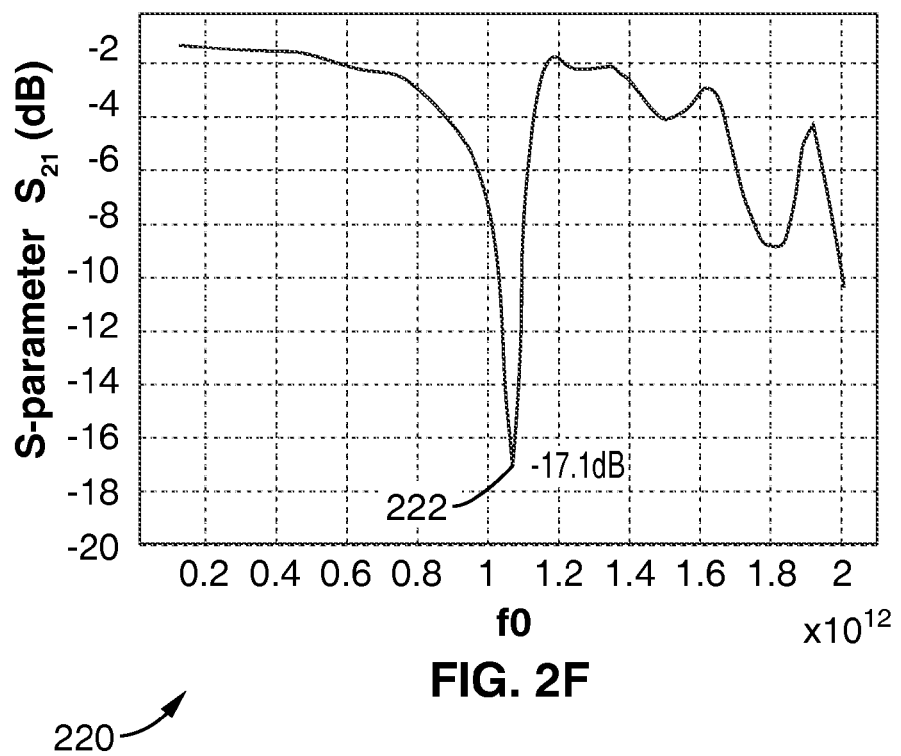

FIG. 2F is a plot of modeled response of a metamaterial with a maximum conductivity of $10^6$ S/m.

Figure 2G:
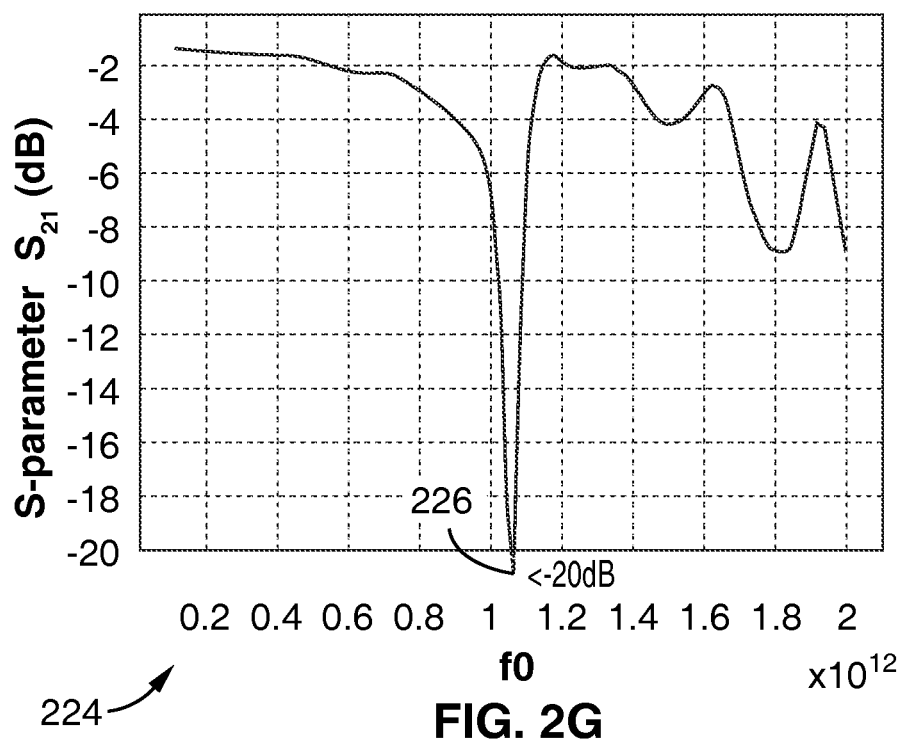

FIG. 2G is a plot of modeled response of a metamaterial with a maximum conductivity of $6\times10^7$ S/m (the conductivity of copper).

FIG. 3A is a top view of another geometrically modifiable split ring resonator in a split ring configuration, where the geometry of the interior capacitor is changed by a controlled conductivity region.

FIG. 3B is a perspective view of an electromagnetic wave incident to a substrate with a patterned array of the devices of FIG. 3A.

FIG. 3C is a schematic of the split ring resonator of FIG. 3A.

Figure 4:
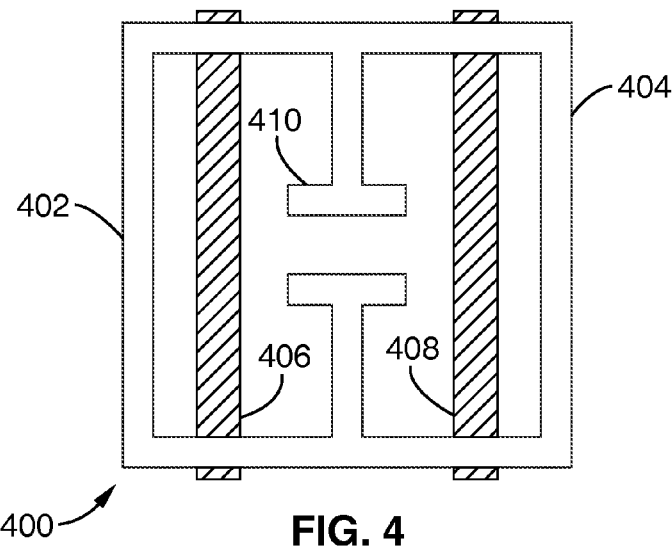

FIG. 4 is a top view of another geometrically modifiable resonator characterized by two initial inductors respectively paralleled with controlled conductivity regions and a central capacitor completing the split ring resonator structure.

Figure 5:
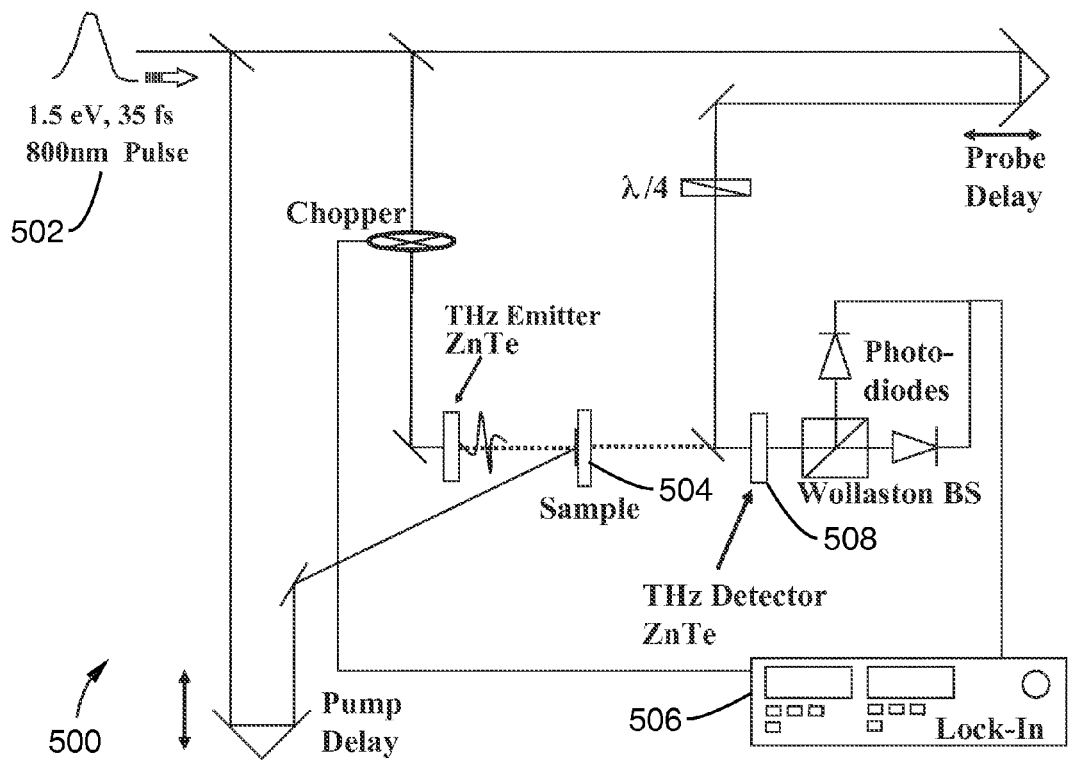

FIG. 5 is an experimental spectroscopic setup for measuring THz transmission through reversibly photodoped metamaterial samples with an ultrafast regeneratively-amplified Ti:Sapphire laser system.

Figure 6:
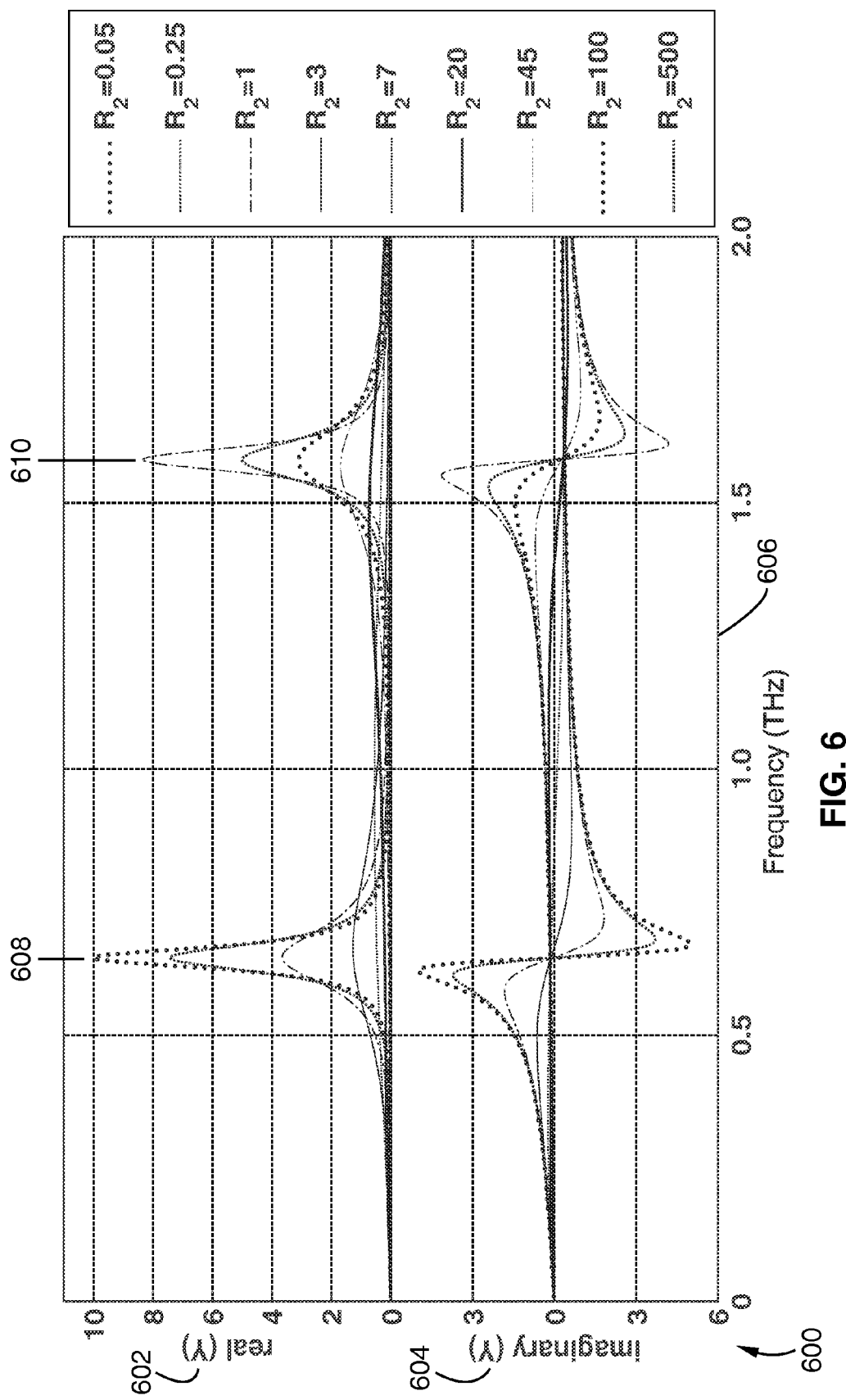

FIG. 6 is a graph of the real and imaginary admittance versus frequency effect of varying $R_2$ in the FIG. 3C circuit model of the tunable SRR, with component values taken as C=0.2 pF, L=2 pH, R=0.1Ω, $C_2$=1 pF.

Figure 7:
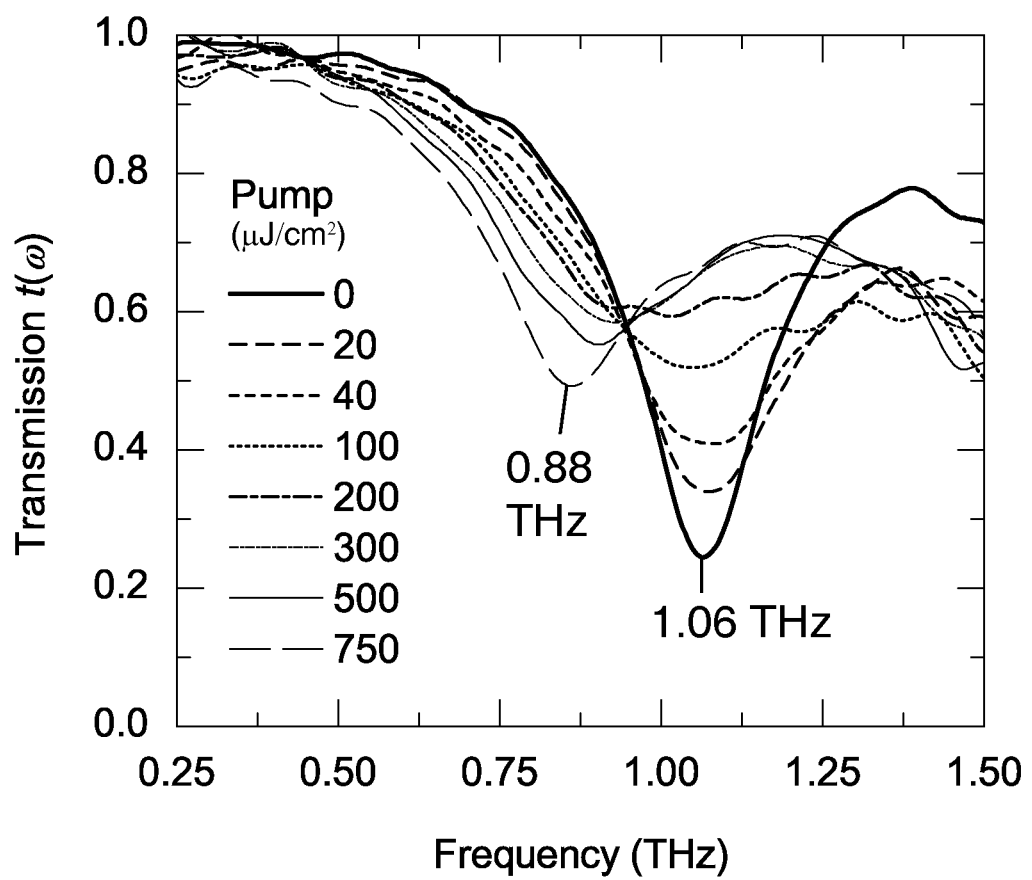

FIG. 7 is a set of graphs of a frequency scan for the fabricated device of FIG. 3A illuminated with Ti:Sapphire laser light at fluence levels of: 0, 20, 40, 100, 200, 300, 500, and 750 µJ/cm².

Figure 8A:
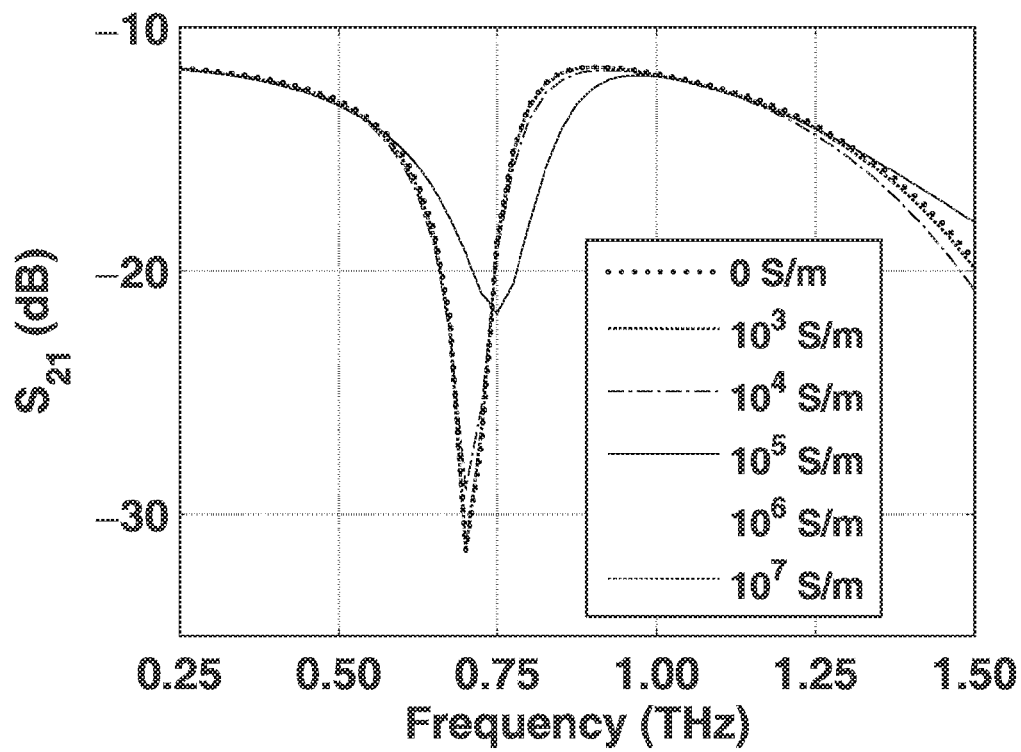

FIG. 8A is a set of graphs of simulations of the controlled conductivity regions of the device of FIG. 1A taken through a range of conductivities.

Figure 8B:
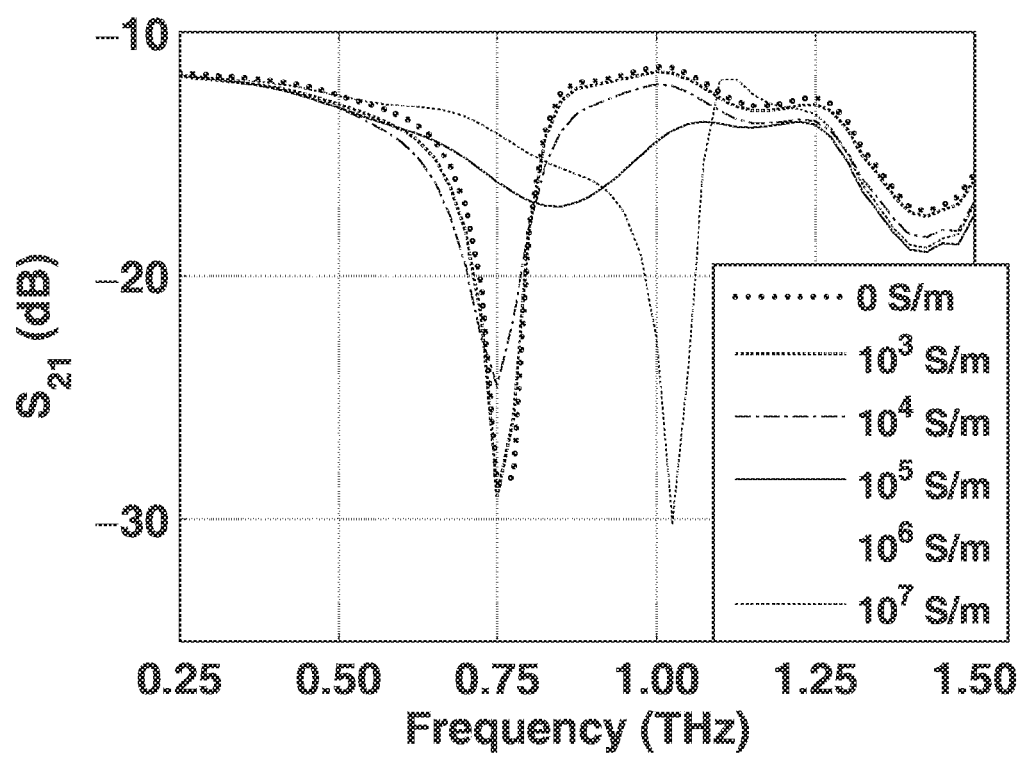

FIG. 8B is a set of graphs of simulations of the controlled conductivity regions of the device of FIG. 4 taken through a range of conductivities.

Figure 8C:
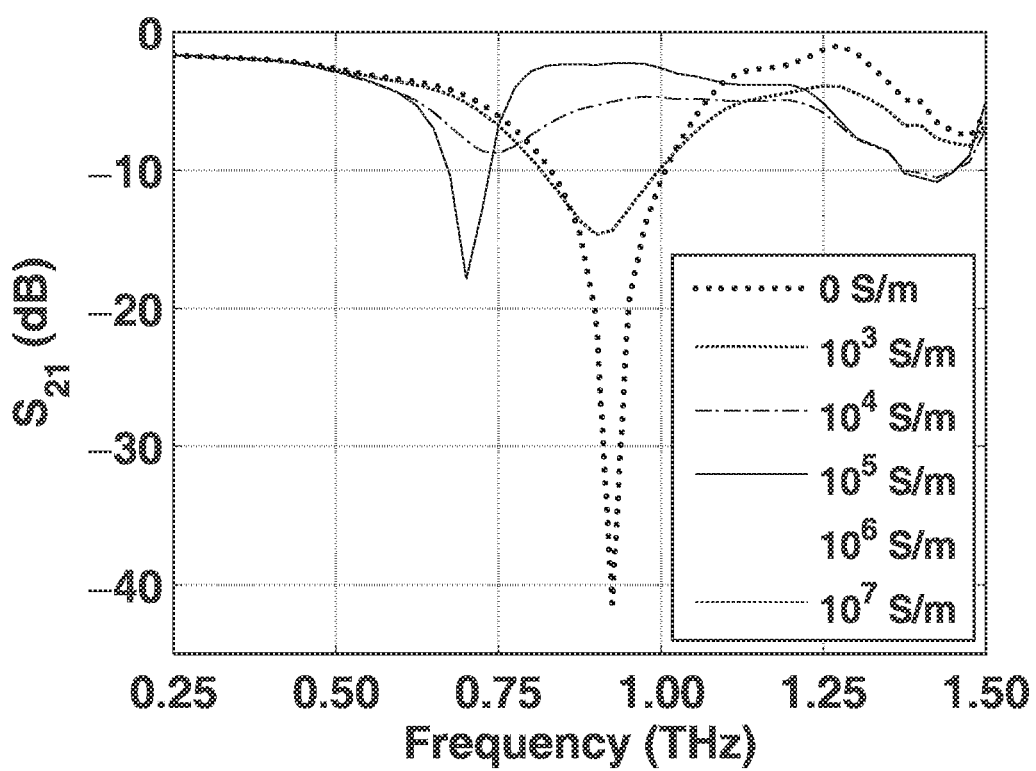

FIG. 8C is a set of graphs of simulations of the controlled conductivity regions of the device of FIG. 3A taken through a range of conductivities.

DETAILED DESCRIPTION OF THE INVENTION

Referring more specifically to the drawings, for illustrative purposes the present invention is embodied in the apparatus generally shown in FIG. 1A through FIG. 8C. It will be appreciated that the apparatus may vary as to configuration and as to details of the parts, and that the method may vary as to the specific steps and sequence, without departing from the basic concepts as disclosed herein.

Definitions

The following definitions are provided to facilitate an understanding of the terminology used herein. It is intended that those terms not present in these Definitions be given their plain meaning as understood by those persons having ordinary skill in the art.

Frequency selective surface (FSS) means a surface designed to reflect or transmit electromagnetic waves with designed frequency discrimination. Such FSS find wide use in various applications such screening a radar transmitter/receiver from hostile emissions, and can also be used to provide a reflective surface for beam focusing in reflector antenna systems for beam steering applications. FSSs are characterized by periodically arrayed resonant structure elements, generally in a planar array. The resonant structures present in FSS are sized to be near the size of the working wavelength of the design frequency, such as half or full wave length in size, where the wave length is that of the designed resonant structure elements.

Metamaterial (also known as 'meta material') means a material that utilizes arrays of tuned sub-wavelength resonator elements to achieve effective continuum material properties such as index of refraction, permeability, and permittivity. The metamaterial therefore gains its properties from its resonator element structure rather than directly from its composition. With metamaterials, permittivity or permeability may be made to be negative (such properties do not normally occur in nature at high frequencies).

Introduction

The term metamaterial is particularly used when the material has properties not found in naturally-formed substances. The term metamaterial was coined by Rodger M. Walser of the University of Texas at Austin in 1999, and defined by him in 2002 as follows: macroscopic composite having a man-made, three-dimensional, periodic cellular architecture designed to produce an optimized combination, not available in nature, of two or more responses to specific excitation.

Metamaterials are of particular importance in electromagnetism (especially optics and photonics), where they are promising for a variety of optical and microwave applications, such as new types of beam steering devices, modulators, band-pass filters, lenses, couplers, and antenna radomes.

For the metamaterial's structure to affect electromagnetic waves, it must have structural features at least as small as the wavelength of the electromagnetic radiation it interacts with. In order for the metamaterial to behave as a homogeneous material accurately described by an effective refractive index, the feature sizes must be much smaller than the wavelength. For visible light, which has wavelengths of less than one micrometer (µm) typically (560 nanometers for sunlight), the structures are generally half or less than half this size; i.e., less than 280 nanometers. For microwave radiation, such features would be on the order of one decimeter. An example of a visible light metamaterial is opal, which is composed of tiny cristobalite (metastable silica) spheres. Microwave frequency metamaterials are almost always artificial, constructed as arrays of current-conducting elements (such as loops of wire) that have suitable inductive and capacitive characteristics.

Metamaterials usually consist of periodic structures, and thus have many similarities with photonic crystals and frequency selective surfaces (FSS). However, these FSS are often considered to be distinct from metamaterials, as their features are of similar size to the wavelength at which they function, and thus cannot be approximated as a homogeneous material in a continuum sense, when compared to the wavelength of the frequency of interest.

Metamaterial Tuning

As discussed above, present day metamaterials lack the ability to rapidly tune frequencies. Typically, the metamaterial is not tunable at all once fabricated.

A novel way to solve the frequency tuning problem of both metamaterials and FSSs is to strategically introduce controlled conductivity regions (CCR) of semiconductor (to act as electrical connections within certain regions of the resonant structures) into specially structured metallic split ring resonator (SRR) used as principal elements in the devices. These strategically located semiconductor CCRs serve to change the inductance or capacitance of various regions in the SRR by creating regions of conductivity that would otherwise be absent.

It should be noted that the semiconductors that form CCRs may originally be either doped or undoped. In the case where they are doped, then they are already conducting, before any photonic or voltage stimulation is applied. For the voltage-based stimulation (as in the manner of a field effect transistor) a bias voltage may be used to drive charge out of the CCR, thus causing it to become less conductive. This mode of decreasing conductivity may be used for tuning FSSs as well as the mode of increasing conductivity. Ultimately, a bias voltage signal, or photonic fluence, may be used to alter a CCR conductivity either more or less conductive, depending on how the CCR is originally fabricated and processed.

Resonator structures (such as SRR element 100), typically made from some highly conductive metal such as gold aluminum, or copper, have a fixed resonant frequency determined by their size, shape, and the materials from which, and upon which, they are fabricated. Upon stimulation, the CCR forms an alternate electrical path through which current can flow around or through the resonator. This alternate path effectively changes the shape or size of the resonator capacitors and/or inductor elements, thereby altering its resonant frequency.

FIGS. 1A-1E describe in detail how this invention may be practiced, with specific features depicted on each figure as noted.

Refer now to FIG. 1A, where we find a top view of a SRR element 100 is potentially one of many such elements arranged in a pattern (an example of this will shortly be given below). For example, here a single SRR 102 is placed on a substrate 104. In FIG. 1B, initially one side of a typical SRR 102 may be comprised only of a straight section 106, which acts as an inductor in the circuit. This straight section 106 can be redesigned and replaced as follows to provide a means for geometrically modifying the SRR 102.

In FIG. 1C, a meandering conductor 108 may be collocated with the straight section 106 previously shown in FIG. 1B. The meandering conductor 108 will change the design resonant frequency of the SRR 102 by decreasing the inductance of the original straight section 106 (the straight section 106 must be a conductor to act as an inductor). Inductance may be further decreased by the addition of a second parallel meandering shape 110. Small areas of controlled conductivity regions (CCR) may be placed (shown as hatched regions 112, 114) over the meandering portions of the meandering inductors 108, 110.

As previously discussed, straight section 106 may have been replaced by a CCR 112. When the CCR regions 112, 114 are inactive, as shown in FIG. 1C, they behave as an insulator (having very high resistivity) and the SRR 102 resonates at a certain frequency corresponding to the inductances of the meandering conductors 108, 110, that in this design are initially at the low frequency range of the SRR 102 tunability range. In this instance, we assume that the CCR 112, 114 are in direct electrical connection with the meandering conductors 108, 110 wherever the elements overlap.

In FIG. 1D, when the CCR 112, 114 are activated, they greatly increase in conductivity, effectively shorting out (here, in three interior locations) the meandering portion respectively of the meandering conductors 108, 110, thus making the net effect of the active CCR 112 and meandering conductor 108 (similarly for CCR 114 and meandering conductor 110) behave more like the straight section 106 inductor that has lower inductance (strictly speaking, the two elements are then electrically shorted, therefore providing a combined element that behaves as if the two overlapping elements were merged as shown in FIG. 1D, given that their conductivities still substantially differ). Here, if CCRs 112 and 114 have sufficient conductivity when active, they merge with the meandering conductors 108 and 110 to form merged inductors 118 (comprised of merged meandering conductor 108 and CCR 112) and 120 (comprised of merged meandering conductor 110 and CCR 114). This merging effects both a change in the geometry of the original meandering conductors 108 and 110, and a reduction in inductance as seen in the SRR 102 circuit. The reduced inductance acts to increase the resonant frequency of the SRR 102.

Referring back to FIG. 1A, border 122 indicates a single instance of SRR 102 that may be used in an array to provide FSS or metamaterial properties. When the SRR element 100 is repeated in an array in a FSS or metamaterial, the effect of the increased resonant frequency of the SRR element 100 effects a change in the continuum resonant response of the FSS or metamaterial as a whole.

Resonance of the SRR 102 also includes a capacitor 124 disposed between the meandering inductors 108, 110 and the CCR sections 112, 114. Because resonance of the SRR 102 occurs with the loops 126, 128, the device is termed a split ring resonator (SRR).

Referring now to FIG. 1E, an alternate fabrication of the SRR 102 provides for CCR 112 attachment only at the ends of its meandering inductor 108 at locations 130, 132. Here, when the CCR 112 is activated, the meandering inductor 108 is paralleled with the straight section 112 inductor, producing a reduced inductance simply through the paralleling of the inductors. Similarly, on the other side of the SRR 102, the alternate fabrication provides for CCR 114 attachment only at the ends of its meandering inductor 110 at end locations 134, 136.

Referring again to FIG. 1E, an alternate fabrication of the SRR 102 provides for CCR 112 attachment only to the ends of the meandering inductor 108 at locations 130 and 132 by insulating pads so that CCR 112 is electrically insulated from SRR 102. Here, when the CCR 112 is activated it forms a capacitive link between the two ends of the meandering section 108. This additional capacitance adds to the original capacitance of SRR 102 and acts to decrease the resonance frequency of the SRR 102. Similarly, on the other side of SRR 102, the alternate fabrication provides for CCR 114 attachment by insulating pads only at the ends of its meandering inductor 110 at end locations 134, 136.

Referring back to FIG. 1A, note that the SRR 102 was designed with approximately 2 μm line widths, with the circuitry occupying a 36 μm×36 μm area, and designed to be operated at approximately 1 THz resonance. Since the SRR 102 structure is symmetric, the device exhibits only an electric resonant behavior. A simulation used for the design and modeling of the SRR element 100 assumes a periodic array of these resonators in order to simplify the calculation. The outer border 122 of the SRR element 100 (in computer simulations taken as 50 μm in width and height) represents the device array lattice boundary. In principle such a periodic arrangement would not be necessary; however more detailed computer simulation techniques would be required for design purposes. Scaling to different frequencies and sizes of this exemplar SRR 102 device will be discussed further at a later point below.

Implementations of Controlled

Conductivity Regions (CCR)

General Comments on CCRs

CCRs can be made from any type of material that can be stimulated to change its conductivity. Some examples include but are not limited to reversibly photodoped semiconductors or doped semiconductors with voltage controlled depletion layers, similar to those used in field effect transistors. The so-called split-ring-resonators (SRR) arrays are useful for demonstrating the concept. In this example, a distribution of SRRs is fabricated onto an insulating substrate. The SRR-based metamaterial can act as a frequency filter (for example) in that it possesses a certain resonant frequency at which it selectively interacts with incident electromagnetic energy. The resonant frequency is determined by the SRR composition and their orientation in the array. For frequency control, each SRR has a separate CCR attached to it. Before this CCR is stimulated to enhance it conductivity, it is essentially electrically inert.

Following stimulation, the CCRs create alternative current paths within or around each SRR, thereby changing effective shapes or sizes of resonator components such as inductors and capacitors. The shape or size resonator changes then change the resonator resonant frequency.

In one example the CCR may be fabricated as defined regions of semi-insulating GaAs which are stimulated to high conductivity via optical illumination (this technique is more fully explained below). Upon altering the stimulating illumination (by blocking, changing the intensity, etc.) the CCR would also change conductivity thereby altering the resonant frequency of the material as a whole. Since photo-doping of semi-insulating GaAs can be a reversible process, this effect could be dynamically modulated by varying photon flux levels.

Since SRRs can be made in a tremendous variety of manners, properties, and sizes, the CCRs must also be tailored to specific applications. For any metamaterial design there are likely to be a specific few SRR designs that optimize desired metamaterial or FSS behavior. Similarly, the CCRs added to these SRRs would also need to be individually tailored for optimum performance; therefore no specific single design is sufficient to completely describe this invention.

It is noted that the tuning of the resonance as described in this invention is by modification of the effective shape, size, or composition of the resonators themselves, not by modification of the bulk substrate upon which they are fabricated. Therefore, CCR regions are likely to be lithographically defined and isolated. This also means that the substrate upon which the resonator structures are grown must NOT be responsive to the stimulation, such as optical illumination or application of a voltage or charge for example, depending on the method chosen for CCR activation.

Past work has shown frequency tunability of similar structures based on modifying the substrate on which resonators are grown by application of either fluids or externally generated magnetic fields. In this invention, the bulk substrate as a whole remains unaltered. Only the small CCR regions are stimulated, which then cause the resonator itself to become modified.

It should be noted further that individual SRR elements may be individually addressed to be tuned to specific frequencies, thus altering FSS or metamaterial function in a new way no bulk-substrate-modified set of devices could.

Reversibly Photodoped Semiconductors as CCRs

In a first embodiment of the invention shown in FIG. 1A, the CCR is implemented as a reversibly photodoped semiconductor in the hatched areas 112, 114 of the SRR element 102. Since the conductivity of the reversibly photodoped semiconductor is determined by the intensity of the incident light, a modulation of the incident light intensity would in turn induce a modulation in the effective inductance or capacitance of the SRR resonant element 102 structure. In the previous example the intensity of the light would control the net inductance of the meandering conductor and corresponding CCR (respectively in sets of numbers 108 and 112, and 110 and 114). A greater photon intensity would induce a correspondingly greater conductivity in the CCR semiconductor (when less than saturation level), which would effect a reduced inductance in the SRR that would in turn raise the SRR 102 resonant frequency. In this way an amplitude modulation of the photon source could frequency control the electric and/or magnetic response of the metamaterial comprised of an array of such SRR resonant elements 102.

In another embodiment of the invention, by using specific CCR semiconductors one could control a binary modulation of the metamaterial frequency response by changing the wavelength of the incoming light. In this case, the light would have to be tunable to two wavelengths, one that has a photon energy below the band gap of the CCR semiconductor, and the other a photon energy above the band gap. In this case, as the incident light is switchably tuned to energies higher and lower than the band gap, it would create a binary switching of the conductivity in the aforementioned band gap semiconductor regions. As the conductivities of these reversibly photodoped semiconductor CCRs were switched, the resonant frequency of the metamaterial comprising an array of such as a whole would in turn switch. In this way an energy (corresponding to a frequency or wavelength) modulated light source could frequency modulate the electric and magnetic response of an array of such reversibly photodoped SRR resonant elements 102 on the surface of such a metamaterial.

Voltage Induced Depletion Layers as CCRs

In another embodiment of the invention, SRRs with CCRs may also be implemented by using voltage induced depletion layers in place of reversibly photodoped semiconductors previously discussed. Instead of increasing the conductivity of the semiconductor regions via reversible photodoping, voltage sources may be used to form depletion layers (like those in transistors) that act as CCR conduction portions within the resonant structures. Like the reversibly photodoped semiconductor previously discussed, these voltage controlled depletion layers would act to change the effective inductance or capacitance of the resonators, thereby tuning the frequency response of the metamaterial as desired. In this way, modulation of a simple voltage source could act to frequency modulate the electric and magnetic response of the metamaterial.

Potential Uses of Resonators with CCR-Variable Components

In other embodiments, the use of CCRs to modify the geometry of various resonators in FSS or metamaterials has the potential to revolutionize both FSS and metamaterials. At this time, metamaterials are comprised only of passive structures that exhibit loss. However, as research continues, it is likely that metamaterials will be used to form electromagnetic radiation sources or amplifiers. The frequency tunability of these sources will likely be critical for proper operation in a variety of applications.

The future benefits of this invention are very broadly applicable to any metamaterial or FSS based devices. Metamaterials themselves are, of course, very diverse in their potential. They can achieve designed magnetic and electric responses at virtually any frequency ranging from radio waves almost all the way up to visible light (at the present). Hence, any method to achieve dynamic tunability of these responses is likely to be both important and beneficial. This idea permits the frequency tunability of metamaterial responses and thereby is beneficial to any potential application of metamaterials at any frequency. One potential application is that of direct laser photonic devices.

Laser Photonics Potential Applications

ErAs:InGaAs is a material that makes it feasible for ultrafast THz devices to operate with uncompromised performance at 1550 nm, instead of the normal 800 nm. Given the relatively high power available in 1550 nm fiber lasers, this marriage of technologies could open a new realm of commercialization of THz systems. This would in theory be done as follows.

By scaling the size of FIG. 1A's SRR element 100 (and correcting for parasitic effects due to the changed size) to a size 193.4 times smaller, a resonant frequency of 193.4 THz should be achieved, which is equivalent to a wavelength of 1550 nm. This results in a scaled line width of 10 nm, which is smaller than present technology, which is currently in production with 65 nm. Extreme ultraviolet laser technology uses $Xe^{10+}$ ion emission with wavelength of 13.4 nm. Thus, it appears that SRR resonators could likely be scaled to directly interact with 1550 nm light in the foreseeable future. It is to be noted that linewidths need not necessarily be scaled by the same amount as the overall SRR structure size thereby alleviating some of the contemporary fabrication constraints.

Commercial Applications

Currently, there are no known commercially available isolators, frequency modulators, switches, and other devices for some portions of the electromagnetic spectrum, most notably in the THz regime (100 GHz-10 THz). Since metamaterials can be custom designed to operate at a specific frequency, this invention permits the implementation of such devices at any designed frequency. Optical and infrared (herein defined as waves with frequencies approximately 10 THz-600 THz) isolators, modulators, etc. are commonplace devices. However they rarely operate in a phase coherent fashion. Tunable metamaterials should afford a level of phase control that is not currently available, thus enabling coherent modulation of optical waves.

Terahertz Radar

In another embodiment, other commercial applications may include terahertz modulators or isolators for use in next-generation radar systems or data communication systems. For example, frequency swept signals are used in modern radar systems to provide increased range resolution. However, there is currently no method to achieve such frequency tuning for THz radar.

Data Communication

In yet another embodiment, the invention described herein may be used for very high frequency modulation. One common example of how much better frequency modulation is than amplitude modulation in data communication is the FM and AM based radio signals. Clearly, FM modulation exhibits a high degree of noise immunity. As metamaterial based sources and amplifiers become available, the importance of frequency tunability will become increasingly obvious. For instance, referring again to the ErAs:InGaAs devices operating at 1550 nm, sub-ps, coherent frequency modulation of the 1550 nm carrier could result in data transfer capabilities on the order of $10^{15}$ bits per second (on the order of a trillion times faster than dial up internet).

Computer Simulations of SRR Devices

Refer now to FIGS. 2A-2G, which are graphs of computer simulations illustrating the tuning of the SRR structure of FIG. 1A. Several simulations were performed while varying the conductivity of the CCRs. The simulations were designed to calculate the resonant absorption of an array of these structures fabricated on insulating GaAs. The simulation assumes a plane electromagnetic wave passing through them. FIGS. 2A-2G illustrate that as the conductivity is changed strength and location of the resonant behavior is altered. The plots all have the same vertical and horizontal scales ranging from 0-2 THz on the horizontal axis and from −20 to 0 dB on the vertical axis. FIGS. 2A-2F show the modeled resonant behavior when the CCRs have conductivities of $10^3$, $10^4$, $5\times10^{-4}$, $10^5$, $5\times10^5$, $10^6$ S/m respectively. FIG. 2G shows when the CCRs are replaced with copper (conductivity $\sim6\times10^7$). From the figures it is shown that the resonant frequency is shifted by about 8%, from 1 THz to 1.08 THz.

In detail, refer now to FIGS. 2A-G, which are plots of the numerically simulated transmission response of a metamaterial comprised of the tuned split ring resonator (SRR) of FIG. 1A's SRR element 100 calculated by altering the conductivity of the CCRs in the meandering split-ring-resonator through a range of values. All plots have an ordinate range of 0-2 THz, and abscissa range of −20 to 0 dB. These plots all simulate the transmission of a plane electromagnetic wave passing through a periodic SRR array.

FIG. 2A is a plot 200 of modeled response of a metamaterial with a maximum conductivity of $10^3$ S/m. Here, the minimum transmission 202 was about −19 dB at 1 THz (the initial design point).

FIG. 2B is a plot 204 of modeled response of a metamaterial with a maximum conductivity of $10^{-4}$ S/m. Here, the minimum transmission 206 was about −18.3 dB, still at about 1 THz (with little frequency shift).

FIG. 2C is a plot 208 of modeled response of a metamaterial with a maximum conductivity of $5\times10^4$ S/m. Here, the minimum transmission 210 was about −14 dB, at about 1.02 THz (about a 2% frequency shift).

FIG. 2D is a plot 212 of modeled response of a metamaterial with a maximum conductivity of $10^5$ S/m. Here, the minimum transmission 214 was about −12.2 dB, at about 1.03 THz (about a 3% frequency shift).

FIG. 2E is a plot 216 of modeled response of a metamaterial with a maximum conductivity of $5\times10^5$ S/m. Here, the minimum transmission 218 was about −14.3 dB, at about 1.08 THz (about an 8% frequency shift).

FIG. 2F is a plot 220 of modeled response of a metamaterial with a maximum conductivity of $10^6$ S/m. Here, the minimum transmission 222 was about −17.1 dB, at about 1.08 THz (about an 8% frequency shift).

FIG. 2G is a plot 224 of modeled response of a metamaterial with a maximum conductivity of $6\times10^7$ S/m (the conductivity of copper). Here, the minimum transmission 226 was more than −20 dB down, at about 1.08 THz (about an 8% frequency shift).

Alternate Resonator Implementations

Refer now to FIG. 3A, which is another geometrically modifiable resonator 300 in a split ring configuration. Here, outer loop inductors 302 and 304 are simply straight conductor sections. These are electrically connected to interior short arms 306 and 308, which come close to touching, but yet do not touch. This close proximity forms a capacitor effect. CCRs abut the end of the interior short arms 306 and 308, with CCR area 310 contacting interior short arm 306, and CCR area 312 contacting interior short arm 308. Taken together, the CCRs 310 and 312 and the ends of interior short arms 306 and 308 form a geometrically modifiable capacitor 314

In simulation, the geometrically modifiable SRR 300 of FIG. 3A exhibits a much larger frequency shift (up to around 30%) but shows much weaker resonances at intermediate CCR conductivities than found in the SRR element 100 of FIG. 1A. When modeled, a gradual conductivity increase of the CCRs 310 and 312 of these structures causes an initial existing resonance to gradually disappear and then reappear at second, different frequency, instead of steadily shifting through a continuum of frequency values. These structures would be ideally suited to binary frequency modulation, but would not work as well for analog modulation as the previous example shown in FIG. 1A.

Refer now to FIG. 3B, a metamaterial or frequency selective surface 316 comprised of a periodic pattern of the geometrically modifiable SRR 300 of FIG. 3A. Due to the simple device structure of the SRR 300, high density packing is possible, as well as scaling to extremely small device sizes. This surface 316 is shown being impinged upon by an incident electromagnetic wave 318, with its modulating electric 320 and magnetic 322 fields.

Refer now to FIG. 3C, which is a simplified electronic schematic 324 of the device of FIG. 3A without parasitic couplings and loss mechanisms. Here, left 326 and right 328 straight inductors with inductance L are connected in parallel. Also connected in parallel with the inductors 326, 328 is resistor 330 of resistance R in series with capacitor 332 with capacitance C. In parallel with capacitor 332 is another resistor 334 of resistance $R_2$ in series with another capacitor 336 with capacitance of $C_2$. Capacitor $C_2$ and resistor $R_2$ behave collectively like a damped capacitor. This circuit is easily modeled using traditional modeling software. One can vary the damping of the resonance associated with the tuning capacitor 336 by varying the resistor 334 in series with it. By increasing the resistance of resistor 330, one may broaden the spectral pass band by reducing the Q of the circuit.

Refer now for FIG. 4 for another geometrically modifiable resonator 400. Here two initial inductors 402 and 404 are respectively paralleled with controlled conductivity regions 406 and 408. Similar to the split ring resonator of FIG. 1A, a central capacitor structure 410 completes the device. As with the earlier SRR variants, this is another easily realized topology.

EXAMPLE(S)

Although somewhat recapping the material previously presented, the following provides experimental validation of several aspects of the invention.

Motivation: Metamaterial concepts are proving to be increasingly useful in the implementation of novel solutions to electromagnetic problems. The split ring resonator (SRR), for example, is not only useful as a sub-wavelength, resonant, magnetic "atom" for which it was originally designed. It has also been applied to various novel filtering and amplitude modulation schemes [see W. J. Padilla, et al., PRL 96, 107401 (2004); H. T. Chen, et al., nature 444, 597 (2006)]. In these cases the functionality of the SRR is switched on or off by effectively shorting out the capacitive gap of the SRR. This can be done optically or electronically, and in either case achieves effective amplitude modulation. These results show that the SRR can also be used to produce frequency tuning of the dielectric resonances of a metamaterial. Such devices offer a number of potential solutions to the long-standing difficulties of high-speed (THz), coherent, and low-noise modulation.

Approach: Selective patterning of semiconductor regions within the metallic structure of an SRR permits the dynamic tunability of the effective structure of the SRR. This, in turn, tunes the resonance of the SRR and therefore the dielectric response of the metamaterial as a whole. Semiconductor regions transition from insulators to conductors upon reversible photodoping. Tunable SRRs are fabricated into square arrays on an insulating sapphire substrate. FIGS. 1A, 3A, and 4 illustrate the structure of three different samples.

Experiment: FIG. 5 shows the experimental spectroscopic setup 500 for measuring THz transmission through experimental samples. An ultrafast regeneratively-amplified Ti:Sapphire laser 502 is used to excite the reversibly photodoped controlled conductivity regions of the samples 504 to high conductivity. THz generation and detection is done via electro-optic methods (details shown but not numbered) with a lock-in amplifier 506 that detects signals from a THz detector 508 using ZnTe as a detection element.

The system 500 operates on a 1 kHz regeneratively amplified laser 502. Up to 750 μJ of pulse energy is delivered to the sample in ~35 fs. The focal spot on the sample was approximately 5 mm in diameter.

Results: Simulations reveal that SRR tuning is not a smooth, linear frequency sweep for the SRR designs shown here. Instead, the frequency shift of the SRR resonance occurs in a three-fold process. Step 1: As the semiconductor conductivity increases, the resonance stays fixed but weakens. Step 2: The weakened resonance shifts in frequency. Step 3: The shifted resonance regains strength. This bistable behavior can be easily shown to be a simple function of damping due to the changing conductivity of the semiconductor region. Using the circuit model in FIG. 3C, one can vary the damping of the current through the tuning capacitor 336 by adjusting the value of the resistor 334 in series with it. The results are shown in FIG. 6.

Referring now to FIG. 6, one finds a graph 600 of the effect of varying $R_2$ in the FIG. 3C circuit model of the tunable SRR. For this simulation C=0.2 pF, L=2 pH, R=0.1Ω, $C_2$=1 pF. The real part of the admittance (Y) 602 of the circuit is greatly reduced during the tuning transition. Only at very small or large $R_2$ is the admittance and thereby the resonance recovered. The graph 600 also has a plot of the imaginary admittance (Y) 604, with the ordinate 606 ranging from 0-2 THz. These plots, each with a different line type, vary the $R_2$ resistance values as follows: 0.05, 0.25, 1, 3, 7, 20, 40, 100, and 5000. The frequencies of peak admittance occur roughly at 0.65 THz (indicated at 608) with an $R_2$=0.020 resistance, and 1.6 THz (indicated by 610) with an $R_2$=1Ω resistance.

Experimental Results:

FIG. 3A illustrates the structure used for an experimental test sample, which is in turn tested in FIG. 7 below.

Refer now to FIG. 7, which shows the frequency response for the fabricated device of FIG. 3A over the range of 0.25 to 1.50 THz. The plot shows amplitude transmission t(ω) ranging from 0 to 1 (100% transmission). Device illumination was provided by the Ti:Sapphire laser 502 in the experimental system 500 previously discussed. With illumination of the CCR areas on the device at flux levels of 0 μJ/cm$^2$ and 750 μJ/cm$^2$, it is seen that there is a significant frequency shifting effect where the resonance shifted from 1.06 THz at no illumination to 0.88 THz at 750 μJ/cm$^2$ illumination. This is a redshift of 0.18 THz. The damped resonance at intermediate illuminations is also apparent.

Refer now to FIGS. 8A-8C, which are simulations showing the metamaterial behavior when the conductivity of the controlled conductivity regions is set to very high (metallic) values. As such, the limitations of frequency tuning become more apparent. Simulation additionally has the benefit that it does not suffer any ill effects of fabrication difficulties that cause additional damping to the resonant structures. FIGS. 1A, 3A, and 4 illustrate the structures used for each of the three different device structures, which are respectively simulated in FIGS. 8A-8C below using commercial finite element software.

FIG. 8A is a simulation of the device of FIG. 1A, with conductivities of the controlled conductivity regions varied from 0, $10^3$, $10^4$, $10^5$, and $10^6$ S/m. This device shows the least ability to tune over a wide frequency spread of any of the three simulation devices but it also suffers the least amount of damping.

FIG. 8B is a simulation of the device of FIG. 4, with conductivities of the controlled conductivity regions varied from 0, $10^3$, $10^4$, $10^5$, $10^6$, and $10^7$ S/m. This device shows perhaps the widest tuning range, but appears much more bistable in nature, with resonances at one frequency generally being replaced with frequencies of a second frequency and having large damping for intermediate frequencies.

FIG. 8C is a simulation of the device of FIG. 3A, with conductivities of the controlled conductivity regions varied from 0, $10^3$, $10^4$, $10^5$, and $10^6$ S/m. This device simulation shows less frequency tuning range than FIG. 8B in simulations, The simulations reveal a frequency tuning from 0.91 THz to 0.70 THz upon optical stimulation or a tunability (redshift) of 0.21 THz. This is consistent with the experimental results although shifted slightly in frequency due to inequalities between simulations and experiments.

CONCLUSION

This invention has shown that split ring resonators can be used to achieve frequency tuning of the dielectric resonance of a metamaterial. Such devices offer a number of potential solutions to the long-standing difficulties of high-speed (THz), coherent, and low-noise modulation.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A geometrically modifiable resonator, comprising:
   a resonator disposed on a substrate; and
   means for geometrically modifying the resonator.

2. The geometrically modifiable resonator of claim 1, wherein the resonator is one of a plurality of resonator elements comprising a metamaterial.

3. The geometrically modifiable resonator of claim 1, wherein the resonator is one of a plurality of resonator elements comprising a frequency selective surface.

4. The geometrically modifiable resonator of claim 1, wherein the resonator is a discrete device.

5. The geometrically modifiable resonator of claim 2, wherein the plurality of resonator elements are disposed in a periodic array.

6. The geometrically modifiable resonator of claim 2, wherein the plurality of resonator elements are disposed in an aperiodic manner.

7. The geometrically modifiable resonator of claim 1, wherein the means for geometrically modifying the resonator does not alter the substrate.

8. The geometrically modifiable resonator of claim 1, wherein the resonator comprises a split ring resonator (SRR).

9. The geometrically modifiable resonator of claim 1, wherein the means for geometrically modifying the resonator comprises one or more controlled conductivity regions that allow a change of geometry of an element of the resonator in one or more of the group consisting of an inductor and a capacitor.

10. The geometrically modifiable resonator of claim 9, wherein one or more of the controlled conductivity regions comprises a photoconductive semiconductor that changes conductivity through reversible photodoping.

11. The geometrically modifiable resonator of claim 9, wherein one or more of the controlled conductivity regions comprises a voltage induced depletion layer of semiconductor that changes conductivity through application of a voltage.

12. The geometrically modifiable resonator of claim 9, wherein the change of geometry of an element of the resonator comprises a change of shape of the element.

13. The geometrically modifiable resonator of claim 9, wherein the change of geometry of an element of the resonator comprises a change of scale of the element either isotropically or anisotropically in a localized planar region of the substrate.

14. The geometrically modifiable resonator of claim 1, wherein the resonator is one element in a terahertz (THz) radar system.

15. A method for fabricating a geometrically modifiable resonator, comprising:
   fabricating a resonator component; and
   fabricating a charge controlled region able to geometrically modify the component;
   whereby the electrical properties of the component are altered.

16. The method for fabricating a geometrically modifiable resonator of claim 15, wherein the component is selected from one of a group of components consisting of an inductor and a capacitor.

17. The method for fabricating a geometrically modifiable resonator of claim 15, wherein said geometrical modifiable resonator is a component of a metamaterial.

18. A geometrically modifiable circuit component comprising a geometrically modifiable inductor or a geometrically modifiable capacitor.

19. A geometrically modifiable circuit component as recited in claim 18, wherein said geometrically modifiable circuit component is a component of a geometrically modifiable resonator.

20. A geometrically modifiable circuit component as recited in claim 19, wherein said circuit component is a component of a metamaterial that includes one or more said geometrically modifiable resonators.

21. A geometrically modifiable circuit component as recited in claim 19, wherein said circuit component is a component of a frequency selective surface that includes one or more said geometrically modifiable resonators.

22. A frequency modulator, comprising:
   one or more geometrically modifiable resonators, each geometrically modifiable resonator comprising one or more controlled conductivity regions;
   whereby the controlled conductivity regions are activated to change a resonance frequency of the geometrically modifiable resonators.

23. The frequency modulator of claim 22, wherein the controlled conductivity regions are activated by a method selected from the group consisting of: reversible photodoping to the controlled conductivity regions; and application of a control voltage to the controlled conductivity regions.

24. The frequency modulator of claim 22, wherein the resonance frequency corresponds to a wavelength selected from the group consisting of: laser emitted light wavelength; a microwave wavelength; a wavelength of 1550 nm±5%; and a wavelength from 10 nm to 1 m.

25. A method for fabricating a geometrically modifiable resonator, comprising:
   fabricating a resonator component; and
   fabricating a controlled conductivity region able to geometrically modify the component;
   whereby the electrical properties of the component are altered.

26. The method for fabricating a geometrically modifiable resonator of claim 25, wherein the component is selected from one of a group of components consisting of an inductor and a capacitor.

27. The method for fabricating a geometrically modifiable resonator of claim 25, wherein said geometrical modifiable resonator is a component of a metamaterial.

* * * * *